United States Patent
Niemann et al.

(10) Patent No.: US 10,763,808 B2
(45) Date of Patent: Sep. 1, 2020

(54) SOURCE MEASURE UNIT WITH GUARD DRIVE CIRCUIT

(71) Applicant: Keithley Instruments, LLC, Solon, OH (US)

(72) Inventors: James A. Niemann, Chagrin Falls, OH (US); Wayne C. Goeke, Hudson, OH (US)

(73) Assignee: Keithley Instruments, LLC, Solon, OH (US)

( * ) Notice: Subject to any disclaimer, the term of this patent is extended or adjusted under 35 U.S.C. 154(b) by 152 days.

(21) Appl. No.: 16/148,463

(22) Filed: Oct. 1, 2018

(65) Prior Publication Data
US 2020/0106410 A1 Apr. 2, 2020

(51) Int. Cl.
  *H03F 3/45* (2006.01)
  *G01R 15/00* (2006.01)
  *G01R 19/00* (2006.01)

(52) U.S. Cl.
  CPC ......... *H03F 3/45475* (2013.01); *G01R 15/00* (2013.01); *G01R 19/0092* (2013.01); *H03F 2200/129* (2013.01); *H03F 2200/36* (2013.01); *H03F 2203/45116* (2013.01); *H03F 2203/45594* (2013.01)

(58) Field of Classification Search
  CPC ........... H03F 3/45475; H03F 2200/129; H03F 2203/45594; H03F 2203/45116; H03F 2200/36; G01R 19/0092; G01R 15/00
  USPC ............................... 324/66, 379, 439, 123 R
  See application file for complete search history.

(56) References Cited

U.S. PATENT DOCUMENTS 5,457,704 A * 10/1995 Hoeher ................. H03M 13/41
  714/794
5,479,570 A * 12/1995 Imagawa ................. G06N 3/08
  706/20
5,491,457 A * 2/1996 Feher .................. H04L 27/2032
  332/100

* cited by examiner

*Primary Examiner* — Giovanni Astacio-Oquendo
(74) *Attorney, Agent, or Firm* — Miller Nash Graham & Dunn; Andrew J. Harrington

(57) ABSTRACT

A test and measurement device including a source configured to output a source signal, a source output configured to output the source signal to a connected cable, a guard drive circuit electrically coupled to the source and configured to receive the source signal and generated a guard drive signal, the guard drive circuit having a gain less than one, and a guard drive circuit output configured to output the guard drive signal to a connected guard.

20 Claims, 6 Drawing Sheets

SOURCE MEASURE UNIT WITH GUARD DRIVE CIRCUIT

TECHNICAL FIELD

Embodiments of the disclosed technology generally relate to electrical test and measurement instrumentation, and in particular, to devices and methods for guarding electrical components from unwanted electrical currents.

BACKGROUND

Guarding is an important aspect of virtually any low-current measurement. Electrical instrument manufacturers typically employ any of a number of conventional techniques to isolate the impedance of a desired measurement from all currents and impedances that are not part of the required measurement. Guarding is essentially a special case of shielding to prevent noise or unwanted currents from becoming part of the measurement by preventing coupling to the measurement leads. Guarding additionally prevents direct current (DC) and, ideally, alternating current (AC) normal mode currents from electrically coupling to the measurement terminal.

In conventional electrical test and measurement systems, the guard is typically driven to exactly the same voltage as the measurement terminal by the test and measurement device. This guard should be present at all locations around the measurement terminal except immediately at the intended measurements. However, several problems arise in the process of driving the guard to the same voltage as the measurement terminal. For example, a feedback path is present from a guard amplifier to the measurement terminal, which is the input of the guard amplifier. Because this amplifier has a feedback path, maintaining frequency stability is required but conventional attempts to do so undesirably change the circuit phase characteristics.

Conventional systems generally involve the addition of resistance in series with the guard amplifier of the guard drive circuit to provide frequency stability, but this decimates the guard's usefulness as a shield. Further, such systems allow the guard voltage to deviate from the measurement node voltage under transient conditions, e.g., due to the series guard resistance, and are thus not sufficient for typical fast low-current measurement systems. Low current measurements require some sort of technique to manage or control which currents or impedances are measured, and which currents are excluded.

Even though the guard amplifier of the guard drive circuit may return to stable operation, provided the resistor is large enough, it is at the expense of guard bandwidth, and a higher impedance guard output and the guard will lag behind the measurement terminal, allowing guarded dielectrics to charge and discharge during transients. Also, longer cables, which generally have more dielectric to charge up, will see undesirably slow guard response and settling time, which is unacceptable performance.

Thus, there remains a need for improved techniques for guard drive circuit integrating with electrical test and measurement equipment.

DETAILED DESCRIPTION

Applications for a number of new and emerging markets, such as the Internet of Things (IoT), require faster low current measurements. IoT products require careful attention to power consumption because there are more battery operated, low power, mission critical devices than ever before. The technique of guarding enables a cabled out low current measurement.

Other applications, such as parametric testing in the semiconductor industry, are becoming more demanding when it comes to electrical test and measurement speed and throughput. The parametric test market generally demands increased throughput, which means that the test time for all measurements must be reduced, especially for low current testing, which typically accounts for most of the device test time.

Embodiments of the disclosed technology are generally directed to electrical test and measurement devices designed to solve the frequency instability problem in a manner that does not require a lower bandwidth guard drive circuit, such as used in conventional systems.

Unlike conventional systems, which typically addressed the coupling path by controlling the phase, embodiments of the disclosed technology generally include removing some of the coupling path and providing a guard drive circuit gain that is less than 1.00, that is, a less than unity gain, to stabilize the remaining coupling path. In such embodiments, the signal is in phase with the measurement. A guard drive circuit will never oscillate if it has insufficient gain.

Figure 1:
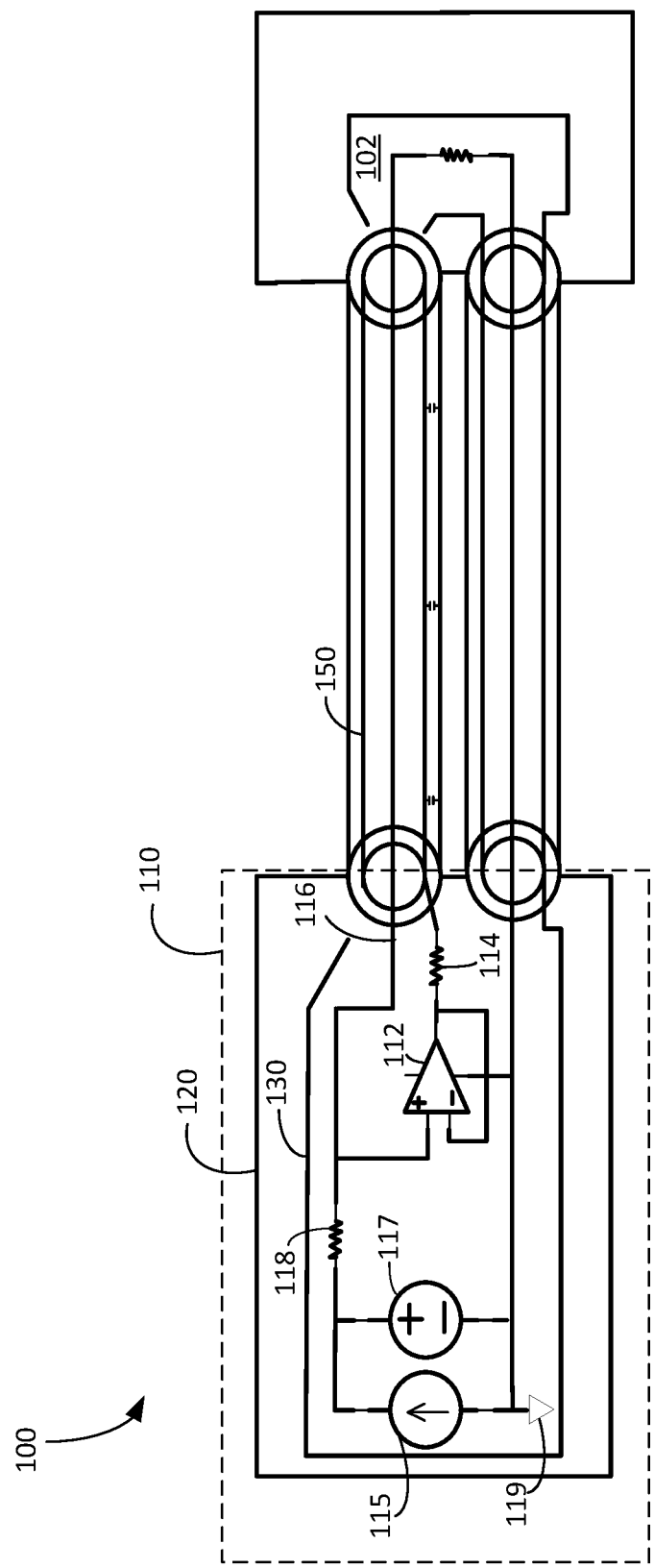
FIG. 1 illustrates an example of an electrical test and measurement device that implements a guard drive circuit.

FIG. 1 illustrates an example of an electrical test and measurement system 100 that implements a guard drive circuit. The system 100 includes a source measure unit (SMU) 110, which has a source, which may be a current source 115 and/or a voltage source 117, a resistor 118, and ground 119, and a device under test (DUT) 102 that are shielded by a chassis 120, an instrument shield 130, and a guard 150.

The SMU 110 includes a guard amplifier 112, which is connected to the guard 150, through a resistor 114. This resistor behaves somewhat differently depending on whether the guard 150 has coupling to ground 119 or not. In either situation, however, the guard amplifier 112 returns to stable operation at the expense of the guard 150 bandwidth, and a higher impedance guard 150. As such, the guard 150 now lags behind the measurement terminal 116, allowing guarded dielectrics to charge and discharge during transients. Further, the resistor 114 value is often chosen for a maximum cable length expected. Longer cables will see the lowest guard response and the slowest settling time. That is, a parametric test environment with the longest cables and switches in the pathway, typically require approximately 10 seconds (s) for a low current measurement to settle into the hundreds of femtoamperes (fA) levels, which is an unacceptable performance for many applications. The guard 150 does eventually return to the correct voltage over time, and the actual measurement does reject all impedances and leakage currents for DC errors.

Figure 2A:
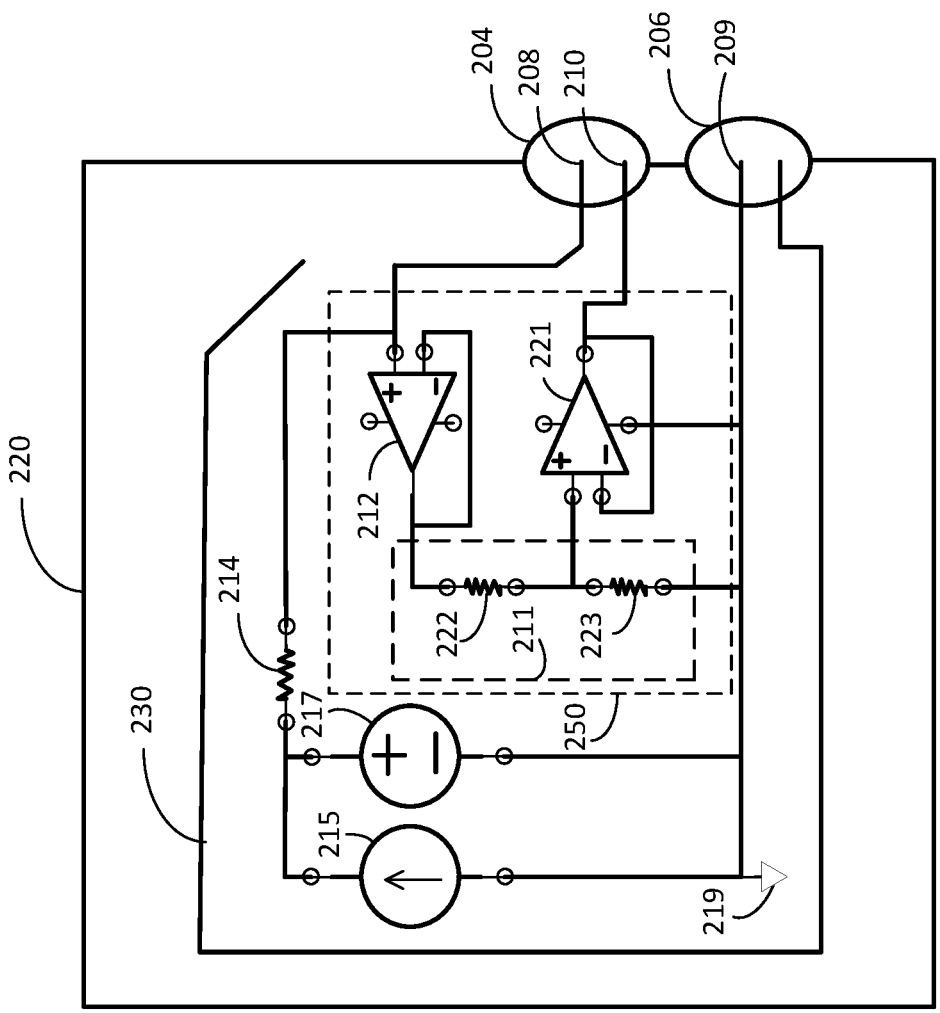
FIG. 2A illustrates a first example of an electrical test and measurement device in accordance with certain implementations of the disclosed technology.

FIG. 2A illustrates a first example of an electrical test and measurement device 200 in accordance with certain implementations of the disclosed technology, which is not limited in bandwidth like the electrical test and measurement system of FIG. 1. The electrical test and measurement device 200, may be, for example, a source measure unit (SMU). A source measure unit is a type of electrical test and measurement device that is capable of sourcing a voltage signal to a device under test (DUT) and measuring a resulting current signal from the DUT, and/or sourcing a current signal to a DUT and measuring a resulting voltage signal from the DUT. As will be understood by one skilled in the art, the test and measurement device 200 may include additional components not illustrated in FIG. 2A.

As illustrated in FIG. 2A, the electrical test and measurement device 200 may connect to a DUT (not shown) through ports 204 and 206. Ports 204 and 206 may be configured to receive a cable, such as a coaxial or triaxial cable, to carry signals between the electrical test and measurement device 200 and the DUT. The electrical test and measurement device 200 can include a source (e.g., current source 215 and/or voltage source 217) configured to output a source signal on a first signal line 208 to the DUT through a cable connected to port 204. The source signal is sent to the DUT through the first signal line 208 and a connected cable. The source signal then travels through the DUT and a second cable is connected from the DUT to port 206 to a second signal line 209, which is connected to ground 219, so that the source signal flows through the DUT to allow a signal from the DUT to be measured by the electrical test and measurement device 200.

The electrical test and measurement device 200 may include a guard drive circuit 250, which may include a first operational amplifier (op-amp) 212, an attenuator circuit 211, and a second op-amp 221. The electrical test and measurement device 200 can also include a first resistor 214, which is electrically coupled between the source 215 and/or 217 and the first op-amp 212. The first resistor 214 is a sensing resistor which may be used by the electrical test and measurement device 200 to measure a current in the system when connected to the DUT.

The attenuator circuit 211 is electrically coupled between the first op-amp 212 and a second op-amp 221. The attenuator circuit 211 may be a resistor divider that includes a second resistor 222 electrically coupled between the first op-amp 212 and the second op-amp 221 and a third resistor 223 electrically coupled between the second op-amp 221 and ground 219, for example. The values of the resistors 222 and 223 may be chosen so that the attenuator circuit 211 is configured to reduce the magnitude of the signal output from the first op-amp such that the ratio between the magnitude of the signal input to the second op-amp and the signal output of the first op-amp (also referred to herein as gain), is less than 1.00, i.e. less than unity gain. An output of the second op-amp 221 is connected to a guard of the cable connected through port 204 via a guard signal line 210. The output of the guard drive circuit, which is the output of the second op-amp 221 can drive the guard of the cable in phase with the first signal line 208 to protect the first signal line 208 from electrical interference. While the guard signal line 210 is shown as part of port 204, as will be understood by one skilled in the art, the guard signal line 210 may be connected through another port (not shown) to the shield of the cable.

The source signal is received at the first op-amp 212, which includes a 100 percent negative feedback path to feed the output of the first op-amp 212 to an input of the first op-amp 212, as illustrated in FIG. 2A. The output of the first op-amp 212 is received at the attenuator circuit 211, which is also connected to the second op-amp 221. As mentioned above, the attenuator circuit 211 has a gain of less than 1.00 and the output of the attenuator circuit 211 is used as the input of the second op-amp 221 (which also includes a feedback loop) to stably drive the guard of the cable connected to the signal line 210 in phase with the first signal line 208. This allows the guard of the cable connected to port 204 to be driven at a voltage nearly identical to the source 215 and/or 217, without limiting the bandwidth. As mentioned above, a guard drive circuit will never oscillate if it has insufficient gain. The attenuator circuit 211 prevents the amplifiers 212 and 221 from oscillating by having a gain less than unity.

The electrical test and measurement device 200 also may include a first shield structure 220, such as a chassis, for example, configured to protect the electrical test and measurement device 200 and first and second signal lines, when connected to a DUT, from electrical interference. A second shield structure 230, which may also be referred to herein as an instrument shield, is configured to further protect the electrical test and measurement device 200 and the DUT, when connected to the electrical test and measurement device 200, from electrical interference. The second shield structure 230 may be connected to the cable through port 206, for example. In other embodiments, the second shield structure 230 may be connected to the cable through another port.

Figure 2B:
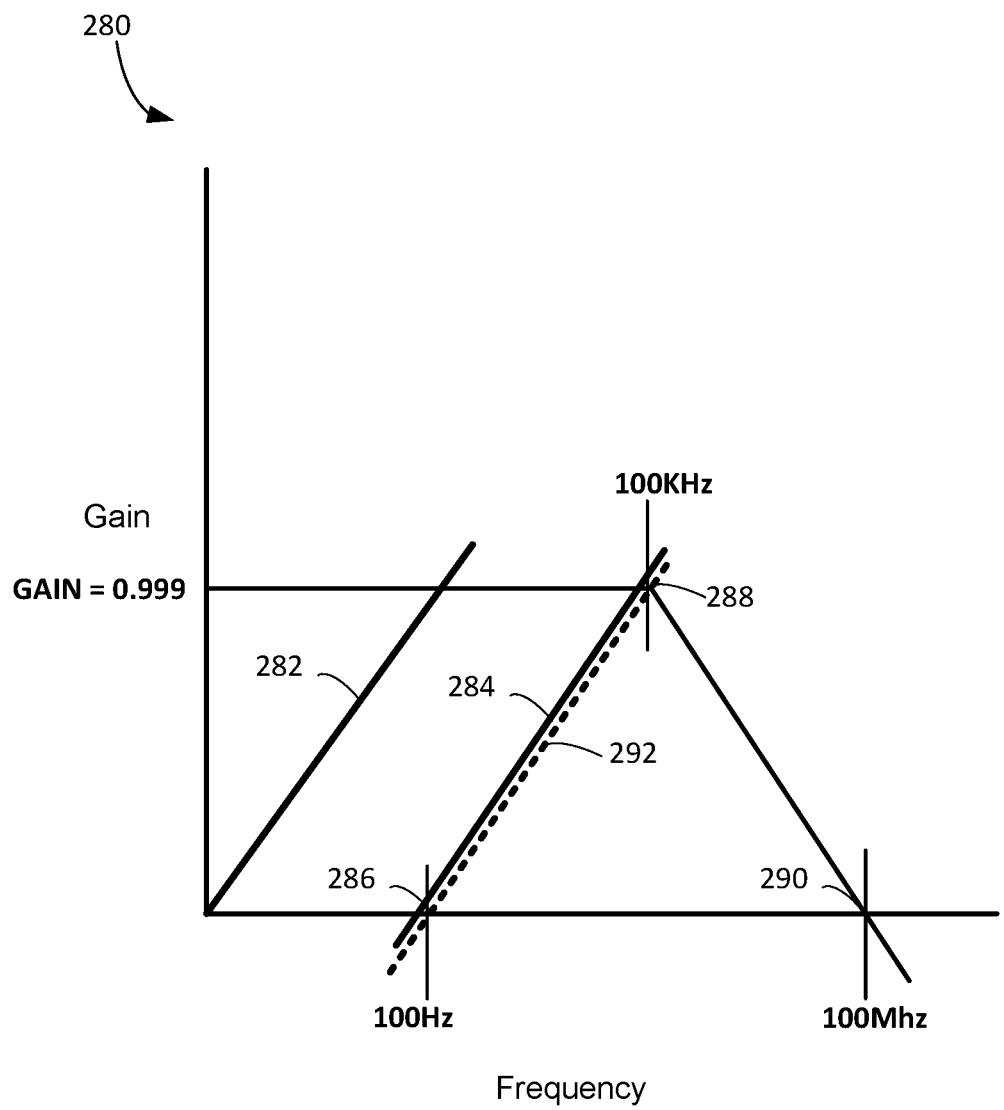
FIG. 2B is an example of a Bode plot illustrating the frequency response of the electrical test and measurement device illustrated by FIG. 2A.

FIG. 2B is an example of a Bode plot 280 illustrating the frequency response of the electrical test and measurement device 200 illustrated by FIG. 2A, when connected to a DUT. The Bode plot 280 shows the range of stable operation for a gain of 0.999 ranging from a very high capacitance, shown via line 282 (e.g., the closure originating at 0 Hz), to the lowest capacitance, shown by line 284 e.g., Cg=1/(Rh)(100 Hz)(2)(PI) (where Rh represents the resistance that is present on the high measurement terminal, e.g., the DUT and any impedance looking back into the SMU). The intersection 286 indicates a pole due to a cable length and an impedance of a low current measurement being performed. Intersection 288 is the point where the guard driving circuit 250 becomes instable, and line 292, shown as a dotted line, indicates where the instability region begins. As can be seen in the Bode plot 280, keeping the gain to less than one prevents line 284 from being in the unstable region. Intersection 290 indicates a gain bandwidth of the guard drive circuit 250.

In the electrical test and measurement device 200 illustrated in FIG. 2A, the gain of the guard circuit amplifiers 212 and 221 may be reduced to any gain less than 1.00 which stabilize the guard drive circuit. While generally effective, this electrical test and measurement device 200 may not be ideal for certain high voltage(s). For example, for a high voltage system, e.g., operating at 1000V, using a 0.999 gain, the guard error voltage will be: $(1-0.999)*1000V=1V$, which may be higher than desired.

Figure 3A:
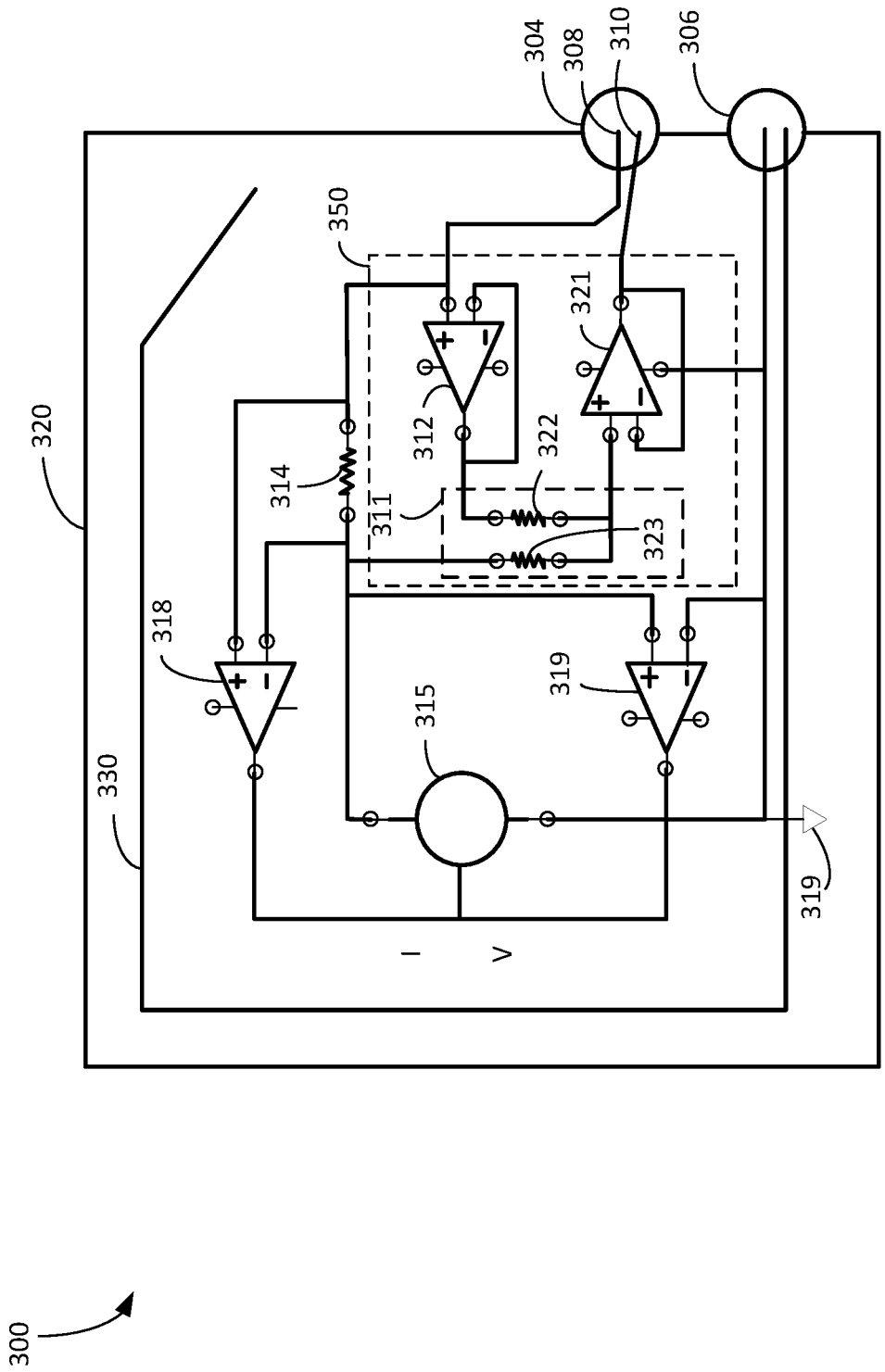
FIG. 3A illustrates a second example of an electrical test and measurement device in accordance with certain implementations of the disclosed technology.

FIG. 3A illustrates another example of an electrical test and measurement device 300 in accordance with certain implementations of the disclosed technology. The electrical test and measurement device 300 includes some components similar to those discussed above with respect to the electrical test and measurement device 200, and accordingly, like components will be numbered with the same reference number plus 100. For example, the electrical test and measurement device 300 may include a first shield structure 320 and a second shield structure 330, which are similar to those discussed above with respect to FIG. 2A, and as such, are not further discussed herein with respect to FIG. 3A.

The electrical test and measurement device 300 may connect to a device under test (DUT) through ports 304 and 306. Ports 304 and 306 may be configured to receive a cable, such as a coaxial or triaxial cable, to carry signals between the electrical test and measurement device 300 and the DUT. The electrical test and measurement device 300 can include a source 315, which may be either a current source or a voltage source, depending on whether voltage or current is fed back to the source 315, as would be understood by one skilled in the art. The source can be configured to output a source signal on a first signal line 308 to the DUT through a cable connected to port 304. The source signal is sent to the DUT through the first signal line 308 and a connected cable. The source signal can travel through the DUT and a second cable is connected from the DUT to port 306 to connect the DUT to a second signal line 309, which is connected to ground 319. This allows the source signal to flow through the DUT so that a signal from the DUT may be measured by the electrical test and measurement device 300 based on the source signal.

Similar to the electrical test and measurement device 200, the electrical test and measurement device 300 may also include a guard drive circuit 350, which may include a first op-amp 312, an attenuator circuit 311, and a second op-amp 321. The electrical test and measurement device 300 can also include a sensing resistor 314, which is electrically coupled between the source 315 and the first op-amp 312. The electrical test and measurement device 300 may also include current measuring device 318 and voltage measuring device 319 as part of the source measure operations.

In the guard drive circuit of FIG. 3A, the attenuator circuit 311 includes a resistor divider that includes a second resistor 322 electrically coupled between the first op-amp 312 and a third resistor 323. In this embodiment, the third resistor 323 is electrically connected to the source signal, rather than ground 319. The values of the resistors 322 and 323 may be chosen so that the attenuator circuit 311 is configured to have an output ratio of less than 1.00. An output of the second op-amp 321 is connected to a guard of the cable connected through port 304 via a shield signal line 310. The output of the guard drive circuit, which is the output of the second op-amp 321, can drive the guard of the cable in phase with the first signal line 308 to protect the first signal line 308 from electrical interference. While the shield signal line 310 is shown as part of port 304, as will be understood by one skilled in the art, the shield signal line 310 may be connected through another port (not shown) to the shield of the cable. In some embodiments, a voltage of the source signal and the voltage from the guard drive circuit may not be equal.

Certain potential deficiencies associated with the electrical test and measurement device 200 illustrated in FIG. 2A may be solved by the electrical test and measurement device 300 illustrated in FIG. 3A wherein some of the coupling path may be eliminated by referencing the 0.999 attenuation to the low impedance source 315 output instead of to ground 319.

Conventional systems, as mentioned above, drive the guard to the source voltage exactly. The coupling of the guard to the source voltage completes the coupling around the guard drive circuit and the attenuator circuit 311 provides a ratio to this coupling that is less than one to prevent the op-amps 312 and 321 from oscillating.

With this ratio change in place, the guard drive circuit may be less influenced by the source signal output on the signal line 308. With the electrical test and measurement instrument 300 output current at or close to zero, which is the usual case when guarding is important, the guard drive circuit is able to drive the guard such that the guard voltage may be nearly perfect. The ratio, or gain, of the attenuator circuit 311 may be changed during production to allow the guard to be at the maximum acceptable error for the value of the full scale current and for the expected resistance to be guarded. As long as the ratio is less than one, the attenuator circuit 311 will prevent the op-amps 312 and 321 from oscillating.

Figure 3B:
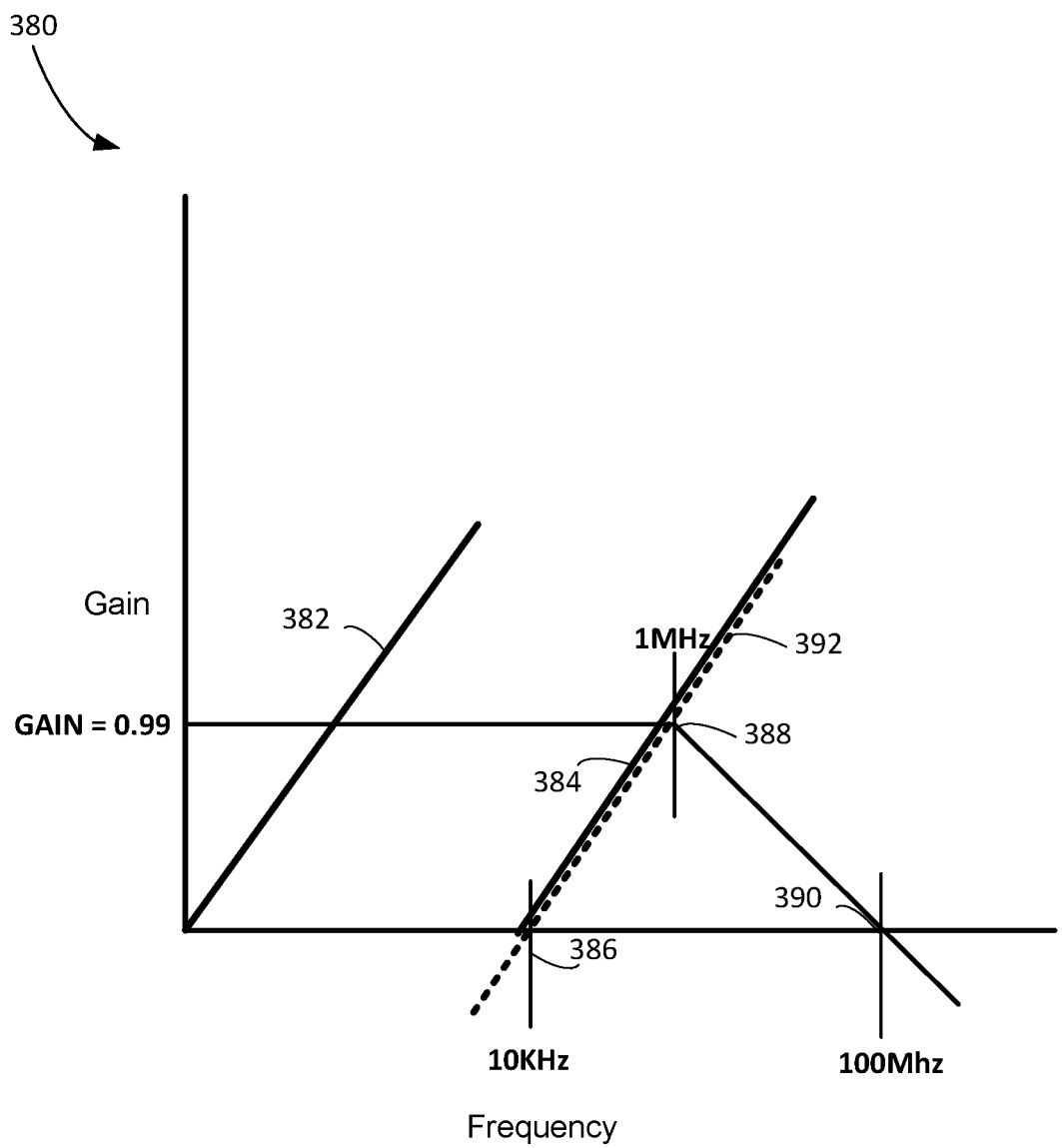
FIG. 3B is an example of a Bode plot illustrating the frequency response of the electrical test and measurement device illustrated by FIG. 3A.

FIG. 3B is an example of a Bode plot 380 illustrating the frequency response of the electrical test and measurement device 300 illustrated by FIG. 3A. The Bode plot 380 shows improvement, e.g., compared to the plot 280 of FIG. 2B. The range of stable operation for a gain of 0.99 ranges from a very high capacitance, shown by line 382 (e.g., the closure originating at 0 Hz), to the lowest capacitance, shown by line 384, e.g., Cg=1/(Rh)(10 kHz)(2)(PI) (where Rh represents the resistance that is present at the port 204). The intersection 386 indicates a pole due to a cable length and an impedance of a low current measurement being performed. Intersection 388 is the point where the guard driving circuit 350 becomes instable, and line 392, shown as a dotted line, indicates where the instability region begins. As can be seen in the Bode plot 380, keeping the gain to less than one prevents line 384 from being in the unstable region. Intersection 390 indicates a gain bandwidth of guard drive circuit 350. As can be seen, the range of stable operation using the electrical test and measurement device 300 of FIG. 3A, expanded from 0 to 10 KHz, versus the 0 to 100 Hz range seen using the electrical test and measurement device 200 of FIG. 2A.

Figure 4:
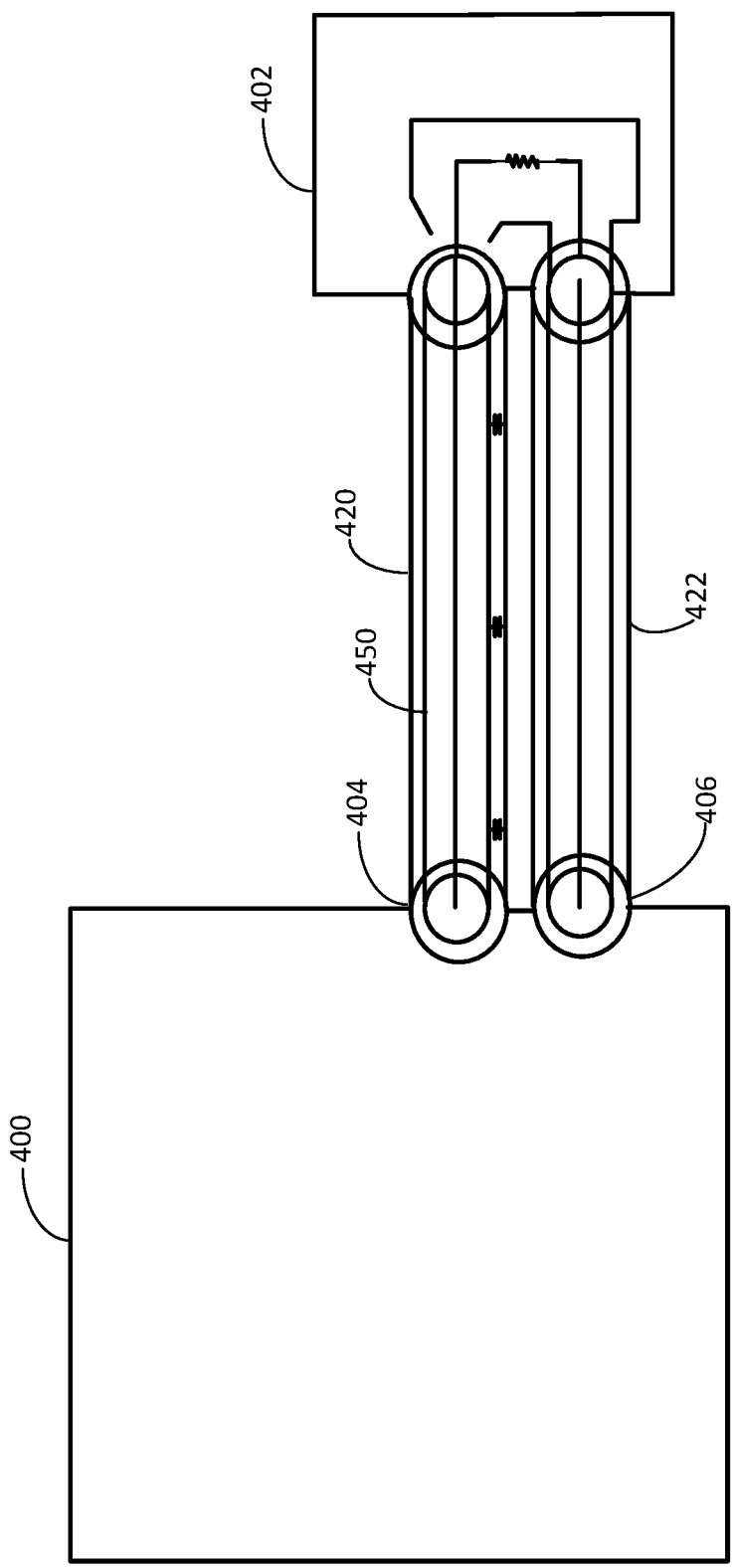
FIG. 4 is an example of a testing system that may incorporate either one of the electrical test and measurement devices of FIGS. 2A and 3A.

FIG. 4 illustrates an example system in which either the electrical test and measurement device 200 or 300 may be used. The system includes an electrical test and measurement device 400, which may be either electrical test and measurement device 200 or 300, connected to a DUT 402 through a first cable 420 which is connected to port 404, similar to either port 204 or 304, and a second cable 422, which is connected to port 406, which is similar to either port 206 or 306.

The first cable 420 may include a guard 450 that is driven by the guard drive circuit of the electrical test and measurement device 400 to prevent electrical interference to the signal running through the first cable 420.

EXAMPLES

Illustrative examples of the technologies disclosed herein are provided below. An embodiment of the technologies may include any one or more, and any combination of, the examples described below.

Example 1 is a test and measurement device, comprising a source configured to output a source signal; a source output configured to output the source signal to a connected cable; a guard drive circuit electrically coupled to the source and configured to receive the source signal and generated a guard drive signal, the guard drive circuit having a gain less than one; and a guard drive circuit output configured to output the guard drive signal to a connected guard.

Example 2 is the test and measurement device according to example 1, wherein the guard drive circuit includes a first operational amplifier electrically coupled to the source and configured to receive the source signal and output a signal based on the source signal; an attenuator circuit electrically coupled to the first operational amplifier and configured to receive the signal from the first operational amplifier and reduce a gain of the signal received from the first operational amplifier; and a second operational amplifier electrically coupled to the attenuator circuit and configured to receive a signal from the attenuator circuit and output the guard drive signal Example 3 is the test and measurement device according to example 2, wherein the attenuation circuit comprises a resistor divider.

Example 4 is the test and measurement device according to example 3, wherein the resistor divider includes a first resistor electrically coupled between the first operational amplifier and the second operational amplifier; and a second resistor electrically coupled between the second operational amplifier and ground.

Example 5 is the test and measurement device according to example 3, wherein the resistor divider includes a first resistor electrically coupled between the first operational amplifier and the second operational amplifier; and a second resistor electrically coupled between the second operational amplifier and the source.

Example 6 is the test and measurement device according to any one of examples 1-5, wherein the guard drive signal is output in phase with the source signal.

Example 7 is the test and measurement device according to any one of examples 1-6, wherein the source is a current source or a voltage source.

Example 8 is the test and measurement device according to any one of examples 1-7, wherein the test and measurement device is a source measure unit, SMU.

Example 9 is the test and measurement device according to example 2, wherein the first operation amplifier and the second operational amplifier each have 100 percent negative feedback.

Example 10 is a method for driving a guard of a cable connected to a test and measurement instrument, comprising generating a source signal; outputting the source signal to an output terminal configured to be connected to the cable; and generating a guard drive signal based on the source signal by attenuating the source signal using a guard drive circuit having a gain of less than one.

Example 11 is the method according to example 10, wherein the source signal is either a current source signal or a voltage source signal.

Example 12 is the method according to ether example 10 or 11, wherein the guard drive circuit includes a resistor divider circuit.

Example 13 is a test and measurement device, comprising a source configured to generate a source signal; a port configured to electrically couple to a cable and a guard of the cable; and a guard drive circuit configured to output a guard drive signal through the port to the guard of the cable. The guard drive circuit includes a first operational amplifier configured to receive the source signal and output a signal based on the source signal; an attenuator circuit electrically coupled to the first operational amplifier and configured to receive the signal from the first operational amplifier and reduce a magnitude of the signal received from the first operational amplifier; and a second operational amplifier electrically coupled to the attenuator circuit and configured to receive a signal from the attenuator circuit and output the guard drive signal.

Example 14 is the test and measurement device according to example 13, wherein the attenuator circuit is a resistor divider, the resistor divider including a first resistor electrically coupled between the first operational amplifier and the second operational amplifier; and a second resistor electrically coupled between the second operational amplifier and ground.

Example 15 is the test and measurement device according to example 13, wherein the attenuator circuit is a resistor divider, the resistor divider including a first resistor electrically coupled between the first operational amplifier and the second operational amplifier; and a second resistor electrically coupled between the second operational amplifier and the source.

Example 16 is the test and measurement device according to any one of examples 13-15, wherein the guard drive signal is output in phase with the source signal.

Example 17 is the test and measurement device according to any one of examples 13-16, wherein the source is a current source or a voltage source.

Example 18 is the test and measurement device according to any one of examples 13-17, wherein the test and measurement device is a source measure unit, SMU.

Example 19 is the test and measurement device according to any one of examples 13-18, wherein the first operation amplifier and the second operation amplifier each have 100 percent negative feedback.

Example 20 is the test and measurement device according to any one of examples 13-19, wherein the attenuator circuit has a gain of less than unity.

The aspects of the present disclosure are susceptible to various modifications and alternative forms. Specific aspects have been shown by way of example in the drawings and are described in detail herein above. However, it should be noted that the examples disclosed herein are presented for the purposes of clarity of discussion and are not intended to limit the scope of the general concepts disclosed to the specific aspects described herein unless expressly limited. As such, the present disclosure is intended to cover all modifications, equivalents, and alternatives of the described aspects in light of the attached drawings.

References in the specification to aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

Communication media means any media that can be used for the communication of computer-readable information. By way of example, and not limitation, communication media may include coaxial cables, fiber-optic cables, air, or any other media suitable for the communication of electrical, optical, radio frequency (RF), infrared, acoustic or other types of signals.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. A test and measurement device, comprising:
    a source configured to output a source signal;
    a source output configured to output the source signal to a connected cable;
    a guard drive circuit electrically coupled to the source and configured to receive the source signal and generate a guard drive signal, the guard drive circuit having a gain less than one; and
    a guard drive circuit output configured to output the guard drive signal to a connected guard.

2. The test and measurement device according to claim 1, wherein the guard drive circuit includes:
    a first operational amplifier electrically coupled to the source and configured to receive the source signal and output a signal based on the source signal;
    an attenuator circuit electrically coupled to the first operational amplifier and configured to receive the signal from the first operational amplifier and reduce a gain of the signal received from the first operational amplifier; and
    a second operational amplifier electrically coupled to the attenuator circuit and configured to receive a signal from the attenuator circuit and output the guard drive signal.

3. The test and measurement device according to claim 2, wherein the attenuation circuit comprises a resistor divider.

4. The test and measurement device according to claim 3, wherein the resistor divider includes:
    a first resistor electrically coupled between the first operational amplifier and the second operational amplifier; and
    a second resistor electrically coupled between the second operational amplifier and ground.

5. The test and measurement device according to claim 3, wherein the resistor divider includes:
    a first resistor electrically coupled between the first operational amplifier and the second operational amplifier; and
    a second resistor electrically coupled between the second operational amplifier and the source.

6. The test and measurement device according to claim 1, wherein the guard drive signal is output in phase with the source signal.

7. The test and measurement device according to claim 1, wherein the source is a current source or a voltage source.

8. The test and measurement device according to claim 1, wherein the test and measurement device is a source measure unit, SMU.

9. The test and measurement device according to claim 2, wherein the first operational amplifier and the second operational amplifier each have 100 percent negative feedback.

10. A method for driving a guard of a cable connected to a test and measurement instrument, comprising:
    generating a source signal;
    outputting the source signal to an output terminal configured to be connected to the cable; and
    generating a guard drive signal based on the source signal by attenuating the source signal using a guard drive circuit having a gain of less than one.

11. The method according to claim 10, wherein the source signal is either a current source signal or a voltage source signal.

12. The method according to claim 10, wherein the guard drive circuit includes a resistor divider circuit.

13. A test and measurement device, comprising:
    a source configured to generate a source signal;
    a port configured to electrically couple to a cable and a guard of the cable; and
    a guard drive circuit configured to output a guard drive signal through the port to the guard of the cable, the guard drive circuit including:
        a first operational amplifier configured to receive the source signal and output a signal based on the source signal;
        an attenuator circuit electrically coupled to the first operational amplifier and
    configured to receive the signal from the first operational amplifier and reduce a magnitude of
    the signal received from the first operational amplifier; and
        a second operational amplifier electrically coupled to the attenuator circuit and configured to receive a signal from the attenuator circuit and output the guard drive signal.

14. The test and measurement device according to claim 13, wherein the attenuator circuit is a resistor divider, the resistor divider including:
    a first resistor electrically coupled between the first operational amplifier and the second operational amplifier; and
    a second resistor electrically coupled between the second operational amplifier and ground.

15. The test and measurement device according to claim 13, wherein the attenuator circuit is a resistor divider, the resistor divider including:
    a first resistor electrically coupled between the first operational amplifier and the second operational amplifier; and
    a second resistor electrically coupled between the second operational amplifier and the source.

16. The test and measurement device according to claim 13, wherein the guard drive signal is output in phase with the source signal.

17. The test and measurement device according to claim 13, wherein the source is a current source or a voltage source.

18. The test and measurement device according to claim 13, wherein the test and measurement device is a source measure unit, SMU.

19. The test and measurement device according to claim 13, wherein the first operation amplifier and the second operation amplifier each have 100 percent negative feedback.

20. The test and measurement device according to claim 13, wherein the attenuator circuit has a gain of less than unity.

* * * * *